US010224418B2

(12) United States Patent
Pei et al.

(10) Patent No.: US 10,224,418 B2
(45) Date of Patent: Mar. 5, 2019

(54) INTEGRATED CIRCUIT FABRICATION WITH BORON ETCH-STOP LAYER

(71) Applicant: GLOBALFOUNDRIES INC., Grand Cayman (KY)

(72) Inventors: Chengwen Pei, Danbury, CT (US); Xusheng Wu, Ballston Lake, NY (US); Ziyan Xu, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 16 days.

(21) Appl. No.: 15/793,419

(22) Filed: Oct. 25, 2017

(65) Prior Publication Data
US 2018/0061969 A1 Mar. 1, 2018

Related U.S. Application Data

(62) Division of application No. 15/157,868, filed on May 18, 2016, now Pat. No. 9,842,913.

(51) Int. Cl.
*H01L 23/48* (2006.01)
*H01L 29/66* (2006.01)
(Continued)

(52) U.S. Cl.
CPC .... *H01L 29/66795* (2013.01); *H01L 21/2225* (2013.01); *H01L 21/2254* (2013.01);
(Continued)

(58) Field of Classification Search
CPC ......... H01L 29/66795; H01L 29/66545; H01L 29/7845; H01L 29/7848; H01L 29/785;
(Continued)

(56) References Cited

U.S. PATENT DOCUMENTS 7,569,913 B2    8/2009  Enicks
9,484,256 B1 *  11/2016  Chen ................. H01L 21/76895
(Continued)

FOREIGN PATENT DOCUMENTS

WO    01/99169 A2    12/2001

OTHER PUBLICATIONS

Nanver et al., "Pure-boron chemical-vapor-deposited layers: A new material for silicon device processing," 18th IEEE Conference on Advanced Thermal Processing of Semiconductors—RTP 2010. Date of Conference: Sep. 28, 2010-Oct. 1, 2010.
(Continued)

*Primary Examiner* — Allen Parker
*Assistant Examiner* — Patricia Reddington
(74) *Attorney, Agent, or Firm* — Anthony Canale; Hoffman Warnick LLC

(57) ABSTRACT

Aspects of the present disclosure include fabricating integrated circuit (IC) structures using a boron etch-stop layer, and IC structures with a boron-rich region therein. Methods of forming an IC structure according to the present disclosure can include: growing a conductive epitaxial layer on an upper surface of a semiconductor element; forming a boron etch-stop layer directly on an upper surface of the conductive epitaxial layer; forming an insulator on the boron etch-stop layer; forming an opening within the insulator to expose an upper surface of the boron etch-stop layer; annealing the boron etch-stop layer to drive boron into the conductive epitaxial layer, such that the boron etch-stop layer becomes a boron-rich region; and forming a contact to the boron-rich region within the opening, such that the contact is electrically connected to the semiconductor element through at least the conductive epitaxial layer.

12 Claims, 8 Drawing Sheets

(51) Int. Cl.
*H01L 21/22* (2006.01)
*H01L 21/225* (2006.01)
*H01L 21/285* (2006.01)
*H01L 29/78* (2006.01)
*H01L 29/207* (2006.01)
*H01L 21/311* (2006.01)

(52) U.S. Cl.
CPC .. *H01L 21/28518* (2013.01); *H01L 21/31144* (2013.01); *H01L 29/207* (2013.01); *H01L 29/66545* (2013.01); *H01L 29/785* (2013.01); *H01L 29/7845* (2013.01); *H01L 29/7848* (2013.01); *H01L 23/48* (2013.01); *H01L 2223/00* (2013.01)

(58) Field of Classification Search
CPC ............. H01L 21/2225; H01L 21/2254; H01L 21/28518; H01L 21/31144; H01L 23/48; H01L 2223/00
USPC .......................................................... 257/368
See application file for complete search history.

(56) References Cited

U.S. PATENT DOCUMENTS

| | | |
|---|---|---|
| 2002/0070413 A1* | 6/2002 | Takeuchi .......... H01L 21/26513 257/408 |
| 2012/0037962 A1 | 2/2012 | Breyta et al. |
| 2012/0252197 A1 | 10/2012 | Clark |
| 2013/0187228 A1 | 7/2013 | Xie et al. |
| 2014/0138779 A1 | 5/2014 | Xie et al. |
| 2014/0179027 A1* | 6/2014 | Tseng ...................... H01L 22/12 438/7 |
| 2016/0013313 A1* | 1/2016 | Cheng .................. H01L 29/267 257/408 |

OTHER PUBLICATIONS

Sarubbi et al., "High Effective Gummel Number of CVD Boron Layers in Ultrashallow p+n Diode Configurations," IEEE Transactions on Electron Devices. 57(6):1269-78 (2010).
U.S. Appl. No. 15/157,868, U.S. Office Action, dated Mar. 29, 2017, 17 pages.

* cited by examiner

INTEGRATED CIRCUIT FABRICATION WITH BORON ETCH-STOP LAYER

BACKGROUND

The subject matter disclosed herein relates to the fabrication of field effect transistors (FETs). More specifically, embodiments of the present disclosure relate to methods of forming integrated circuit (IC) structures which use a boron layer used as an etch stop, and resulting IC structures which include a boron-rich region for transistors to electrically connect contacts to source and drain terminals.

In integrated circuit (IC) structures, a transistor is a critical component for implementing digital circuitry designs. Generally, a transistor includes three electrical terminals: a source, a drain, and a gate. By applying different voltages to the gate terminal, the flow of electric current between the source and the drain can be turned on and off. The gate of a transistor can be formed as a gate stack structure (i.e., a "metal gate stack") composed of a metal separated from a semiconductor element by a gate dielectric layer. Two processing paradigms for fabricating a gate stack can include a gate-first approach or a gate-last approach. The gate-last approach can also be known as a "replacement metal gate" (RMG) process flow, in which other portions of the transistor (e.g., source and drain contacts, channel region, etc.) are formed using a dummy gate structure that is replaced with the final gate after fabrication of other parts. The performance of transistors formed through an RMG process is at least partially dependent on the various processes applied during manufacture. For example, the amount of electrical conductivity and resistance between a contact to the transistor and the various components and regions thereof can affect quantities such as operating speed, manufacturing quality, variance between units, degradation of materials over time, etc.

BRIEF SUMMARY

A first embodiment of the present disclosure provides a method of forming an integrated circuit (IC) structure, the method including: growing a conductive epitaxial layer on an upper surface of a semiconductor element; forming a boron etch-stop layer directly on an upper surface of the conductive epitaxial layer; forming an insulator on the boron etch-stop layer; forming an opening within the insulator to expose an upper surface of the boron etch-stop layer; annealing the boron etch-stop layer to drive boron into the conductive epitaxial layer, such that the boron etch-stop layer becomes a boron-rich region; and forming a contact to the boron-rich region within the opening, such that the contact is electrically connected to the semiconductor element through at least the conductive epitaxial layer.

A second embodiment of the present disclosure provides an integrated circuit (IC) structure including: a gate structure positioned on a semiconductor element; a conductive epitaxial layer positioned on the semiconductor element and laterally abutting a sidewall of the gate structure; a boron-rich region positioned on an upper surface of the conductive epitaxial layer; an insulator positioned on the boron-rich region and laterally abutting the gate structure; and a contact extending through the insulator and positioned directly on an upper surface of the boron-rich region.

A third embodiment of the present disclosure provides a method of forming an integrated circuit (IC) structure, the method including: growing a conductive epitaxial layer on at least one semiconductor fin; forming a boron etch-stop layer directly on the conductive epitaxial layer; forming an insulator on the boron etch-stop layer; forming an opening within the insulator to expose an upper surface of the boron etch-stop layer; annealing the boron etch-stop layer to drive boron into the conductive epitaxial layer, such that the boron etch-stop layer becomes a boron-rich region; and forming a contact to the boron-rich region within the opening, such that the contact is electrically connected to the at least one semiconductor fin through at least the conductive epitaxial layer.

BRIEF DESCRIPTION OF THE DRAWINGS

These and other features of the present disclosure will be more readily understood from the following detailed description of the various aspects of the disclosure taken in conjunction with the accompanying drawings that depict various embodiments of the disclosure, in which.

It is noted that the accompanying drawings are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the present disclosure provide methods of forming integrated circuits (ICs) using boron etch-stop layers, in addition to related structures. Methods according to the present disclosure can be integrated with and/or performed alongside methods of processing an IC structure for metal gate replacement, e.g., replacement metal gate (RMG) processes. Processes according to the present disclosure can yield a transistor structure which exhibits, e.g., reduced electrical resistance between a contact and a source or drain terminal of the transistor as compared to conventional transistor structures. The reduced electrical resistance can be provided by forming and/or modifying additional structures between a contact to the transistor and a source or drain region of the transistor. According to embodiments, methods of forming an IC structure can include forming a boron etch-stop layer on a conductive epitaxial layer positioned on a semiconductor element, and annealing the boron etch-stop layer after forming a contact opening to form a boron-rich region, and forming a contact to the boron-rich region.

To provide reduced resistance and streamlined manufacturability, embodiments of the present disclosure can include growing a conductive epitaxial layer (including, e.g., epitaxially formed silicon (Si) or silicon germanium (SiGe)) on an upper surface of a semiconductor element, e.g., a layer or fin of semiconductor material, to be used in a transistor structure. A boron layer can then be formed directly on an upper surface of the conductive epitaxial layer. An insulative region can be formed on the boron etch-stop layer, with a portion of the same being etched back to form a contact opening and expose the upper surface of the boron etch-stop layer. Embodiments of the present disclosure can also include annealing the boron etch-stop layer to form a boron-rich region, and forming a silicide region within the boron-rich region before forming a contact thereto. The processes described herein can yield an electrical connection from the contact to a source/drain region of the substrate through at least the conductive epitaxial layer.

Figure 1:
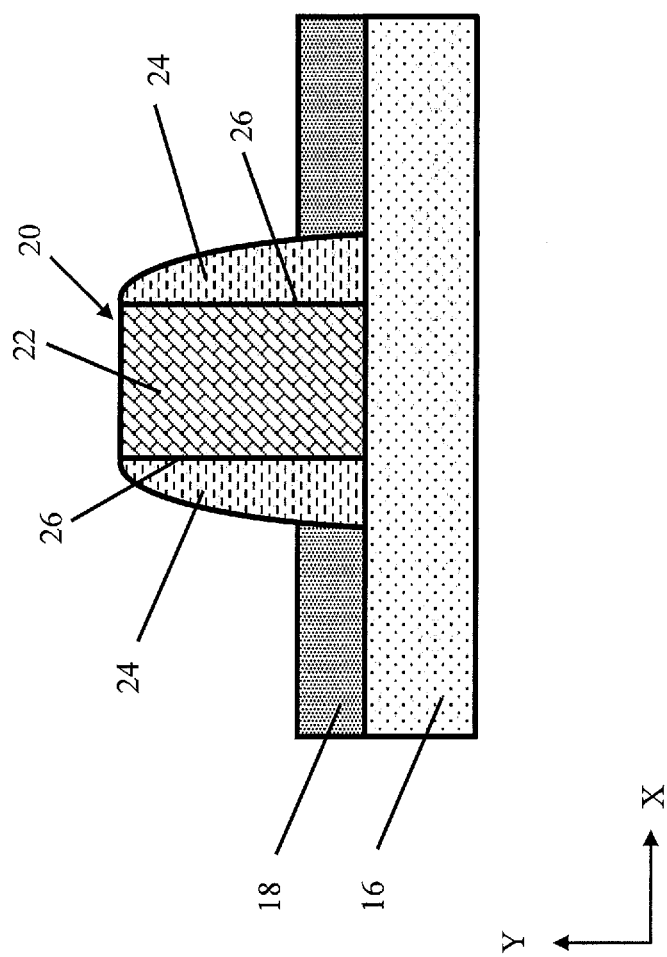
FIG. 1 shows a cross-sectional view of a conductive epitaxial layer and a gate structure formed on a semiconductor element according to embodiments of the present disclosure.

Turning to FIG. 1, an initial process according to embodiments of the present disclosure is shown. An integrated circuit (IC) structure can be formed on a semiconductor element 16, which can be fabricated according to preliminary process steps and/or can be provided by an independent user or third party. Semiconductor element 16 can be in the form of, e.g., a precursor semiconductor wafer structure from which one or more transistors can be fabricated. Semiconductor element 16 can be composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of semiconductor element 16 or a portion thereof may be strained.

Semiconductor element 16 is described generally by example herein as being in the form of any structure composed of semiconductor material, and in some embodiments may be formed as a single layer of semiconductive material, a semiconductor fin used in a finFET transistor, and/or other forms of semiconductor material typically used in the fabrication of IC products. A finFET refers to a transistor typically built from an SOI substrate, where semiconductor material positioned on a buried insulator layer is etched into one or more fin-shaped structures to act as a channel. It is understood that the various process steps discussed herein can be implemented in the same manner and/or with slight modifications for semiconductor elements 16 embodied in forms other than a silicon layer. Further, semiconductor element 16 may be a remaining portion of a single semiconductor-on-insulator (SOI) substrate composed of a layer of semiconductor material bonded to and positioned over a buried insulator layer, as described elsewhere herein. Although semiconductor element 16 is shown by example in FIGS. 1-7 as being in the form of one structure or region, it is therefore understood that processes according to the present disclosure can use any conceivable number of semiconductor elements 16.

A conductive epitaxial layer 18 can be formed on exposed surfaces (e.g., upper surfaces, sidewalls, etc.) of semiconductor element 16. Conductive epitaxial layer 18 can include, e.g., one or more electrically conductive materials capable of being grown epitaxially on a semiconductor, e.g., a semiconductor material such as silicon (Si) or silicon germanium (SiGe) which may be doped or intermixed with boron (B). "Epitaxy" or "epitaxial growth," as used herein, refers to a process by which a thin layer of single-crystal or large-grain polycrystalline material is deposited on a base material with similar crystalline properties. As used herein, the term "depositing" may include any now known or later developed technique appropriate for deposition, including but not limited to, for example: chemical vapor deposition (CVD), low-pressure CVD (LPCVD), plasma-enhanced CVD (PECVD), sub-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. In addition, "removing" as used herein can include any one of various material removal or polishing techniques now known or later developed, e.g., etching, wet etching, a reactive ion etch (RIE), etc. "RIE" or "reactive ion etch" refers to a variation of plasma etching in which, during etching, a semiconductor wafer is placed on an RF powered electrode. Throughout RIE, the wafer may take on an electric potential which accelerates the etching species extracted from plasma toward the etched surface.

In the case of conductive epitaxial layer 18, semiconductor element 16 can act as a seed layer for epitaxial growth of conductive epitaxial layer 18 thereon. Epitaxial growth can occur in such a way that the crystallographic structure of the underlying seed layer becomes reproduced in the epitaxially grown material. In some cases (e.g., the forming of finFET transistors, as discussed elsewhere herein), conductive epitaxial layer 18 can grow laterally outward from exposed sidewalls of semiconductor element 16. Conductive epitaxial layer 18 can be formed by the use of epitaxial chemical vapor deposition (CVD). That is, a chemical reaction in the gas-phase which produces a solid material to be deposited on an exposed material. Epitaxy by deposition generally can be performed at temperatures several hundred degrees Celsius (° C.), but it is understood that lower temperatures can be used in modified forms of this process. Conductive metals such as boron (B) are be introduced to the grown semiconductor material before growing the material on semiconductor element 16, or after the material is grown on semiconductor element 16. Boron can incorporated into conductive epitaxial layer 18 by any currently known or later developed process, e.g., implantation and/or doping. Doping generally refers to a process by which foreign materials are added to a semiconductor structure to alter its electrical properties, e.g., resistivity and/or conductivity. Implantation, by contrast, refers to a process in which ions are accelerated toward a solid surface to penetrate the solid up to a predetermined range based on the energy of the implanted ions.

A gate structure 20 can also be formed on semiconductor element 16 and may be embodied as, e.g., an operational gate or a preliminary gate structure to be modified or replaced in subsequent process steps. For the purposes of example, gate structure 20 is described herein as being in the form of a preliminary structure which is modified in a replacement metal gate (RMG) process, discussed elsewhere herein. Gate structure 20 can include a dummy gate 22 positioned over and contacting semiconductor element 16. In addition to being formed on semiconductor element 16, gate structure 20 and its components can extend laterally into and out of the plane of the page such that other portions of gate structure 20 contact and overlie other components, e.g., an exposed upper surface of a buried insulator layer. The composition of dummy gate 22 can include one or more structures capable of being processed and removed in a subsequent process step, e.g., a sacrificial metal, polysilicon, etc. Dummy gate 22 can be formed on semiconductor element 16, e.g., by deposition, and may include a set of sidewall spacers 24 laterally abutting its opposing sidewalls 26 and positioned on semiconductor element 16. Sidewall spacers 24 can be formed from an electrically insulating material (e.g., one or more dielectric substances, discussed herein) and can physically separate dummy gate 22 from epitaxial layer 18 and materials formed thereon. Gate structure 20 can optionally include additional materials, e.g., insulator caps formed on dummy gate 22 and/or dielectric liners positioned between dummy gate 22 and semiconductor element 16 or spacers 22, but such optional features are omitted from FIG. 1 for the purposes of simplicity.

Figure 2:
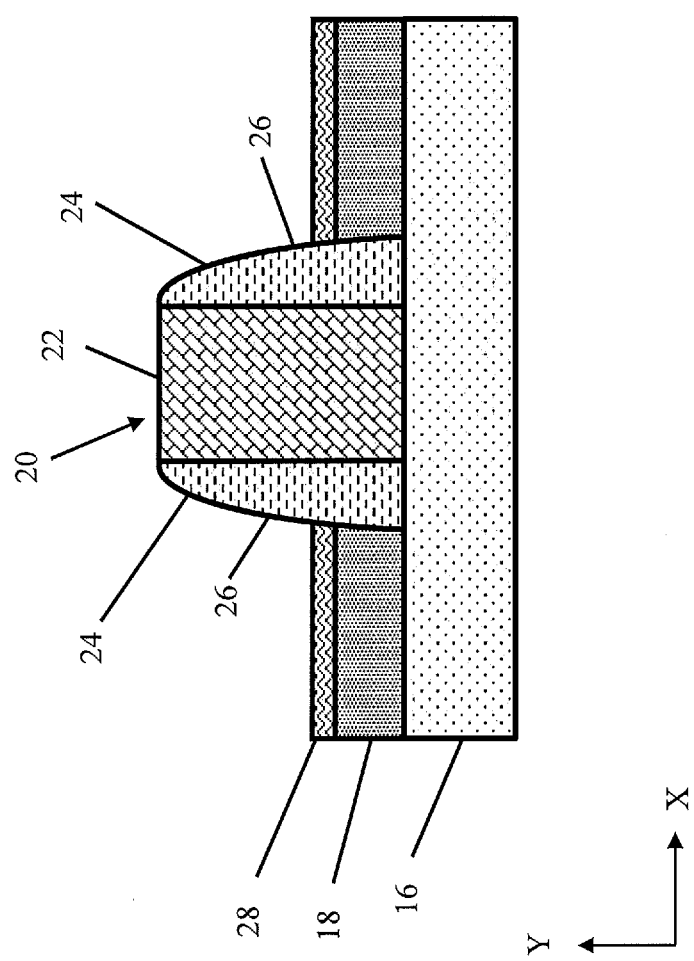
FIG. 2 shows a cross-sectional view of a boron etch-stop layer formed on the conductive epitaxial layer according to embodiments of the present disclosure.

Turning to FIG. 2, embodiments of the present disclosure include forming a boron etch-stop layer 28 on an upper surface of conductive epitaxial layer 18 as a precursor to forming additional transistor structures and electrical connections thereto. In an example embodiment boron etch-stop layer 28 can be composed of a pure boron layer positioned directly on an upper surface of conductive epitaxial layer 18. Boron etch-stop layer 28 can be formed on conductive epitaxial layer 18, e.g., by one or more deposition processes including chemical vapor deposition (CVD), plasma-enhanced chemical vapor deposition (PECVD), and atomic layer deposition (ALD), etc. Upon being formed, boron etch-stop layer 28 may have a thickness in the range of between approximately two nanometers (nm) and approximately five nm.

Figure 3:
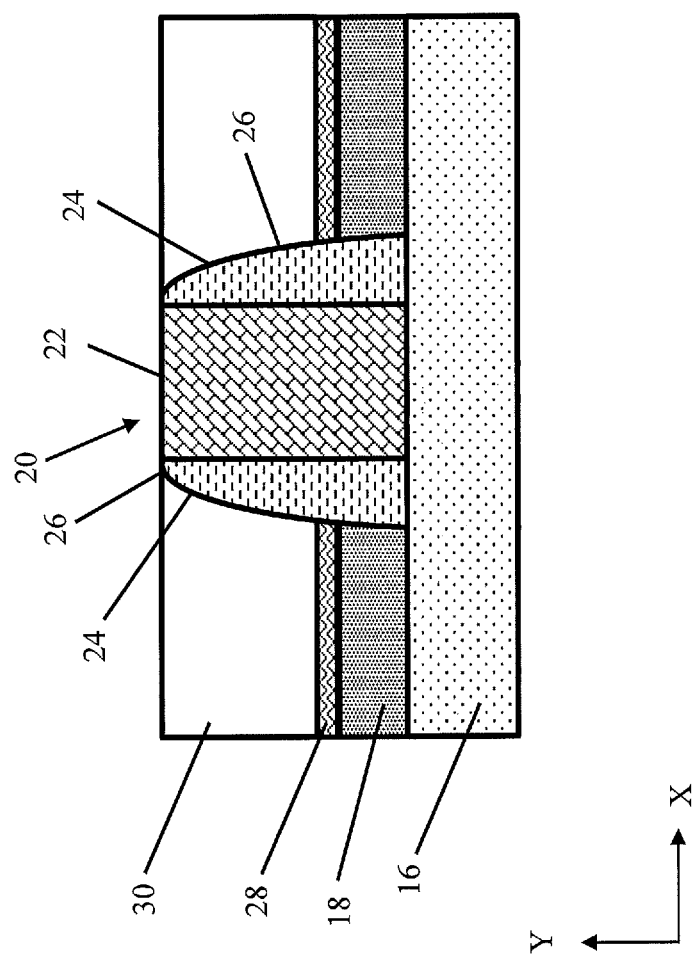
FIG. 3 shows a cross-sectional view of an insulator being formed on the boron etch-stop layer according to embodiments of the present disclosure.

Turning to FIG. 3, embodiments of the present disclosure can include forming an insulator 30 on boron etch-stop layer 28 and adjacent to gate structure 20. Insulator 30 can be composed of any insulating material such as $SiO_2$ or a dielectric having a high dielectric constant, which may be, for example, above 3.9. In some situations, insulator may be composed of an oxide substance, and correspondingly may be referred to as a buried oxide (BOX) layer. Materials appropriate for the composition of insulator 30 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties. Insulator 30, more generally, can be composed of a "high-k" dielectric (i.e., materials with a dielectric constant of at least 3.9. Insulator 30 can initially be formed as a single, continuous layer, but can later be processed to include openings to expose elements positioned below insulator 30 in other processes, as discussed herein. Initially, a portion of insulator 30 may contact and overlie gate structure 20. After being formed, an upper surface of insulator 30 can be planarized, e.g., via chemical mechanical polishing (CMP) such that an upper surface of insulator 30 is substantially coplanar with an upper surface of gate structure 20. An upper surface of dummy gate 22 can be exposed after the planarizing, with the remaining elements formed on semiconductor element 16 (i.e., conductive epitaxial layer 18 and boron etch-stop layer 28) being positioned below insulator 30.

Figure 4:
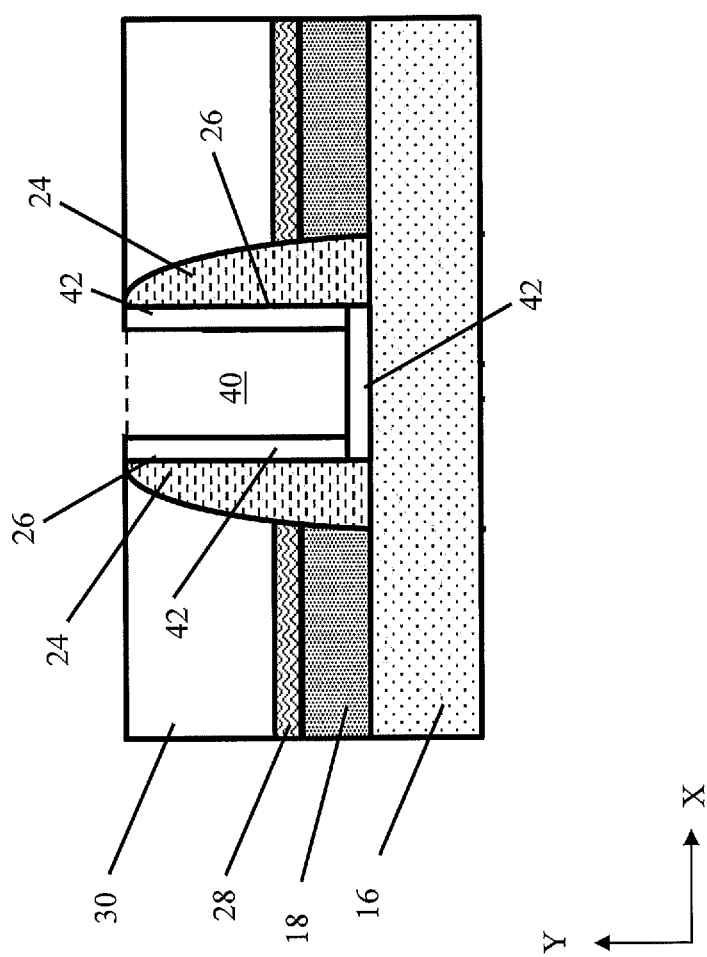
FIG. 4 provides a cross-sectional view of a gate opening being formed according to embodiments of the present disclosure.

Turning to FIG. 4, embodiments of the present disclosure can optionally include removing dummy gate 22 (FIGS. 1-4) to form a gate opening 40. Dummy gate 22 can be removed selectively from gate structure 20 after insulator 30 is formed, such that sidewall spacers 24 remain intact on sidewalls 26 while an upper surface of semiconductor element 16 is exposed. Processes for removing dummy gate 22 can include etching dummy gate 22 with an etchant selective to the material composition thereof, e.g., a polysilicon-selective wet etchant (e.g., hydrogen bromide (HBr), ammonia ($HN_3$), nitric acid ($HNO_3$), etc.). After gate opening 40 is formed, a gate dielectric 42 can be formed on the inner sidewalls of sidewall spacers 24 and the exposed upper surface of semiconductor element 16. Gate dielectric 42 can be provided as a thin layer of insulating material formed, e.g., by thermal growth. In an example embodiment, gate dielectric 42 can be provided as a layer of silicon dioxide ($SiO_2$) with or without nitrides being included therein. In some cases, other types of insulators with higher dielectric constants (e.g., hafnium (Hf-based dielectrics including oxide and/or silicate) can be used to form gate dielectric 42. Other materials can be formed in gate opening 40 to yield a transistor gate (e.g., in the form of an RMG) in additional processes.

Figure 5:
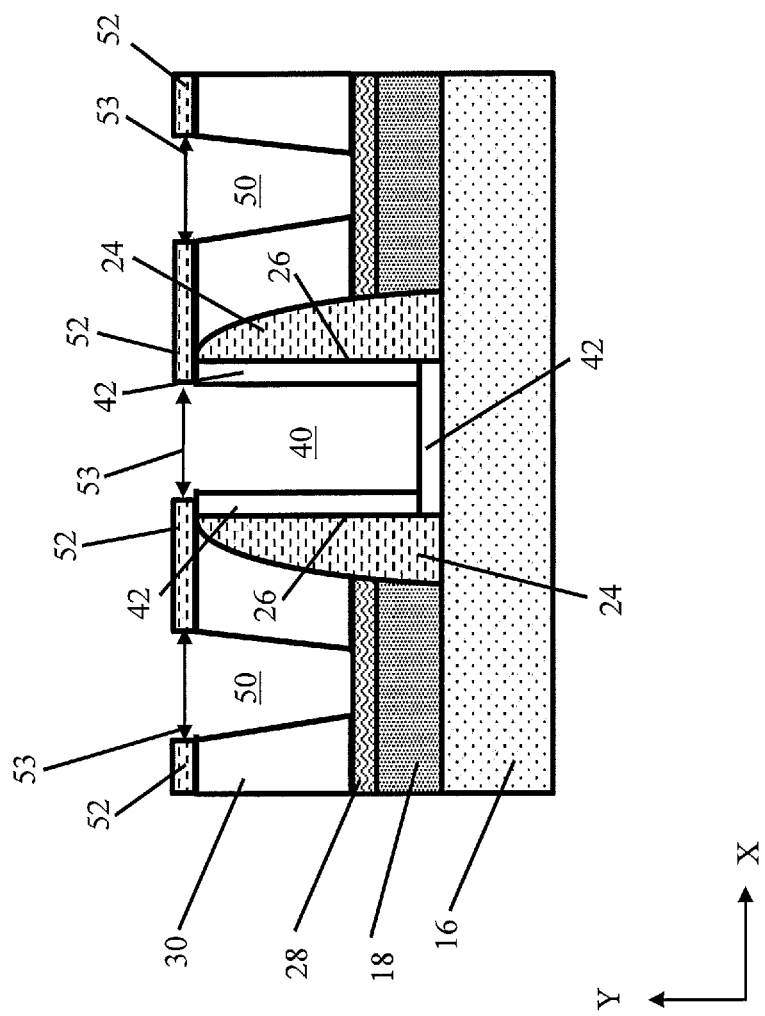
FIG. 5 provides a cross-sectional view of removing a portion of the insulative region to form an opening according to embodiments of the present disclosure.

Turning to FIG. 5, portions of insulator 30 can be removed to form openings 50 to expose an upper surface of boron etch-stop layer 28 thereunder. The size of openings 50 can be selected by one or more conventional lithographic techniques, e.g., forming a lithographic mask 52 on insulator 30 with gaps 53 which expose areas of insulator 30 targeted for removal. The term "mask" and/or "lithographic mask" may refer to a layer of material which is applied over an underlying layer of material, e.g., insulator 30, to protect at least a portion of the underlying material from further processes (e.g., dry etching or wet etching), and/or to further protect any structures covered by a photoresist. Common masking materials are photoresist (resist) and nitride. Other suitable materials for lithographic mask 52 can include, e.g., amorphous carbon, low-temperature oxides (LTOs) such as crystalline silicon oxynitride (SiON), and layered materials including several masking substances. Lithographic mask 52 can be formed, e.g., by being deposited over insulator 30 and/or gate opening(s) 40. Some gaps 53 within lithographic mask 52 may also expose gate opening(s) 40 in addition to portions of insulator 30 targeted for removal.

Portions of insulator 30 exposed by gaps 53 in lithographic mask 52 can be removed by any currently-known or later-developed process for removing an electrically insulative material, e.g., etching. According to one embodiment, removed portions of insulator 30 can be removed by a non-selective etch of insulator 30 to form openings 50 with the same cross-sectional area of gaps 53 within lithographic mask. Where gap(s) 53 are positioned over gate opening(s) 40, a selective etch may remove portions of insulator 30 without significantly affecting the insulator materials included in gate dielectric 42. In other embodiments, lithographic mask 52 can cover gate opening(s) 40 to protect gate dielectric 42 from being etched with insulator 30. The formed openings 50 in insulator 30 can expose an upper surface of boron etch-stop layer 28. In addition to affecting the performance of transistors yielded from embodiments of the present disclosure, boron etch-stop layer 28 can be etched at a substantially lower rate than insulator 30 due to its different mechanical composition. Thus, a user can terminate the etching of insulator 30 after boron etch-stop layer 28 becomes exposed, e.g., based on a total etching time based on the etchants used, the material compositions of boron etch-stop layer 28 and insulator 30, and/or other factors. Due to the substantial differences in etch rate between boron etch-stop layer 28 and insulator 30, a negligible amount of material may be removed from boron etch-stop layer 28 after openings 50 have been formed.

Figure 6:
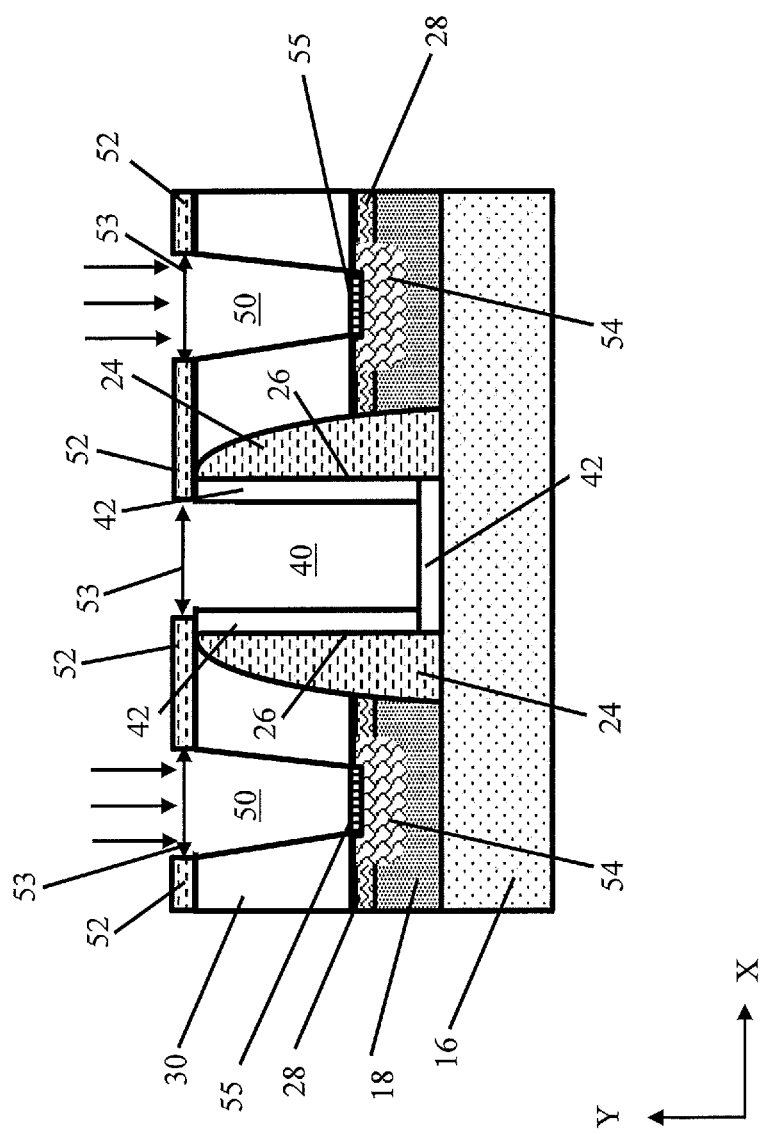
FIG. 6 provides a cross-sectional view of a boron-rich region and a silicide region being formed according to embodiments of the present disclosure.

Turning to FIG. 6, embodiments of the present disclosure include forming a boron-rich region 54 by thermally annealing boron etch-stop layer 28 (represented by arrows in FIG. 6) to induce boron migration from boron etch-stop layer 28 into conductive epitaxial layer 18. Annealing boron etch-stop layer 28 can also cause semiconductor materials from conductive epitaxial layer 18 to migrate into boron etch-stop layer 28 to change its composition and form a boron-rich region 54. Due to the relatively thin size of boron etch-stop layer 28, boron-rich region 54 will cover a larger cross-sectional area than the annealed portion of boron etch-stop layer 28, e.g., by extending into portions of conductive epitaxial layer 18 positioned below opening(s) 50. The resulting boron concentration within boron-rich region 54 can be in the range of, e.g., approximately ten boron atoms per cubic centimeter and approximately twenty boron atoms per cubic centimeter. In addition, the migration of boron from boron etch-stop layer 28 during the annealing can cause boron-rich region 54 to include a substantially uniform boron doping profile therein, i.e., such that the concentration of boron atoms within boron-rich region 54 is not location-dependent.

Although boron-rich region 54 is described by example as being formed after insulator 30 and openings 50 therein have been formed, alternative embodiments can include forming boron-rich region 54 within boron etch-stop layer 28 before forming insulator 30 thereon. However, boron etch-stop layer 28 may have a lower etch rate before boron-rich region 54 is formed therein. In any event, boron-rich region 54 can be embodied as a crystalline structure positioned at least partially within conductive epitaxial layer 18 and adjacent to sidewall spacers 24 of gate structure 20. In addition, annealing boron etch-stop layer 28 after insulator 30 and openings 50 are formed can cause a portion of boron etch-stop layer 28 to remain present on conductive epitaxial layer 18 and laterally adjacent to boron-rich region 54.

To improve electrical conductivity between boron-rich region 54 and other components formed in opening(s) 50, embodiments of the present disclosure can include forming a silicide region 55 within boron-rich region 54. Silicide region 55 may be formed using any now known or later developed technique, e.g., performing an in-situ pre-clean, and depositing a metal such as titanium (Ti), nickel (Ni), cobalt (Co), molybdenum (Mo), etc., on boron-rich region 54. Thereafter, the deposited metal can be annealed to cause the metal to react with boron-rich region 54. Any unreacted portions of the deposited metal may be removed, e.g., by additional etching. The resulting silicide region 55 can have a higher electrical conductivity than a remainder of boron-rich region 54, by virtue of having conductive metals therein, after the annealing.

Figure 7:
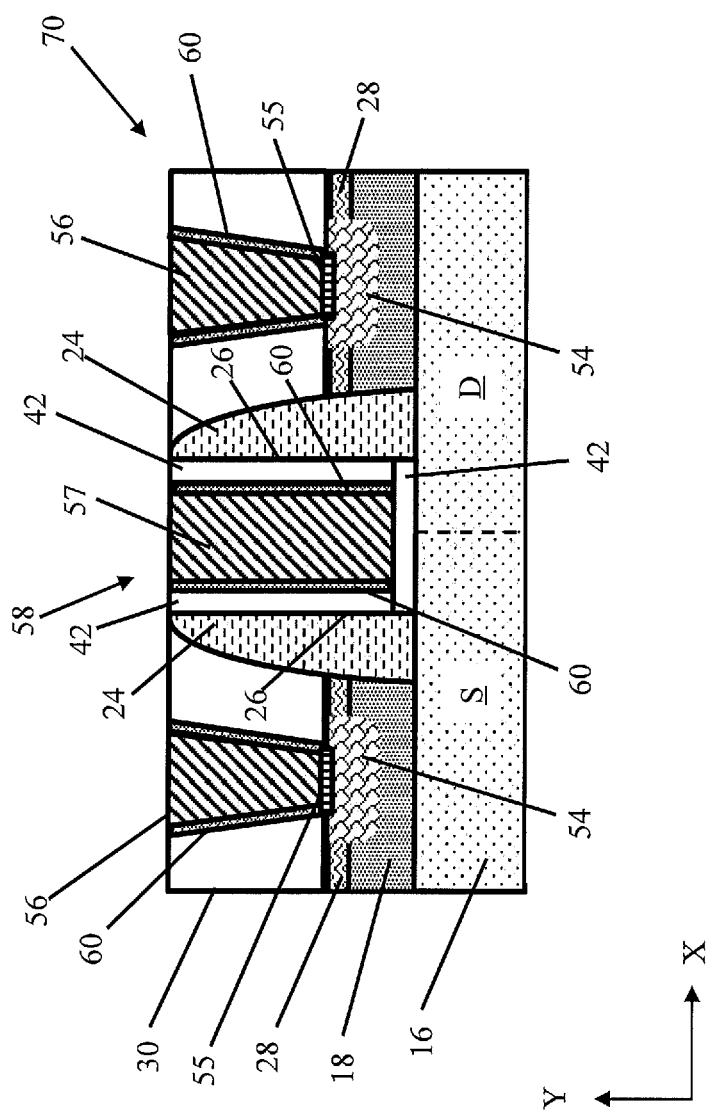
FIG. 7 provides a cross-sectional view in plane X-Y of an integrated circuit (IC) structure according to embodiments of the present disclosure.

Turning to FIG. 7, processes according to the present disclosure can include removing lithographic mask 52 (FIG. 6) in addition to filling openings 50 (FIG. 6) with respective contact(s) 56. In addition, gate opening(s) 40 (FIGS. 5-6) can be filled with a gate metal 57 in a unified process. Before contact(s) 56 and/or gate metal(s) 57 are formed, a refractory metal liner 60 can be formed on the sidewalls of openings 50 (FIG. 6) and/or gate dielectric 42, e.g., by deposition. Such liners 60 can be composed of, e.g., as cobalt (Co), manganese (Mn), titanium (Ti), tungsten (W), ruthenium (Ru), iridium (Ir), rhodium (Rh) and platinum (Pt), etc., or mixtures of thereof (e.g., alloys), and in any case can physically separate adjacent components in a structure.

Contacts 56 and/or gate metal 57 can be formed in openings 50 and/or gate opening(s) 40 in contact with liner(s) 60, e.g., by depositing one or more electrically conductive materials therein. Contacts 56 may be composed of, e.g., copper (Cu), aluminum (Al), gold (Au), and/or other conductive metals conventionally formed to serve as electrically conductive structures in an IC. Where some of the deposited metal is positioned on top of insulator 30, the excess material can be removed from the upper surface of insulator 30, e.g., by CMP and/or other planarization techniques. Regardless of the chosen implementation, contact(s) 56 can be formed in a pair and positioned laterally adjacent to gate structure 58, such that each contact 56 serves as a source/drain contact. More specifically, each contact 56 can each be electrically connected to a respective source region S and drain region D of semiconductor element 16 through conductive epitaxial layer 18, boron-doped etch-stop layer 30, and silicide region 55. A threshold voltage applied to gate metal 57 can thereby control the electrical connection between corresponding contacts 56.

A gate metal 57 can be formed in gate opening 40 (FIGS. 5-6) (e.g., by deposition) and in contact with liner(s) 60 before being planarized (e.g., by CMP) such that an upper surface of metal gate metal 57 is substantially coplanar with an upper surface of insulator 30. Gate metal 57 can be composed of one or more electrically conducting materials including without limitation: metals, polysilicon, etc., formed on gate dielectric 42 by application of deposition and/or one or more other currently known or later-developed processes of forming a material. In any event, gate dielectric 42 and gate metal 57 can together form a gate stack structure (i.e., a "metal gate stack") in which gate metal 57 is separated from semiconductor element 16 only by gate dielectric 42. The resulting gate structure 58 (e.g., a replacement metal gate (RMG)) can function as a gate terminal of a transistor yielded from processes according to the present disclosure. It is also understood that in alternative embodiments, gate structure 58 can be formed on SOI structure 10 before performing other processes described herein, or after other processes according to the present disclosure are implemented.

The processes described herein can yield an IC structure 70 which includes and/or functions as a finFET transistor during operation. In particular, gate structure 58 can be positioned on and electrically connected to semiconductor element 16, with contacts 56 providing an electrical connection to semiconductor element 16 through conductive epitaxial layer 18, boron-rich region 54, and silicide region 55. IC structure 70 can include conductive epitaxial layer 18 and boron-rich region 54 therein. Among other advantages, IC structure 70 can reduce or prevent portions of semiconductor element 16 and conductive epitaxial layer 18 from being removed during processing, reduce the amount of contact resistance to source and drain regions S, D, and/or provide a uniform concentration of dopants throughout boron-doped etch-stop layer 30.

Figure 8:
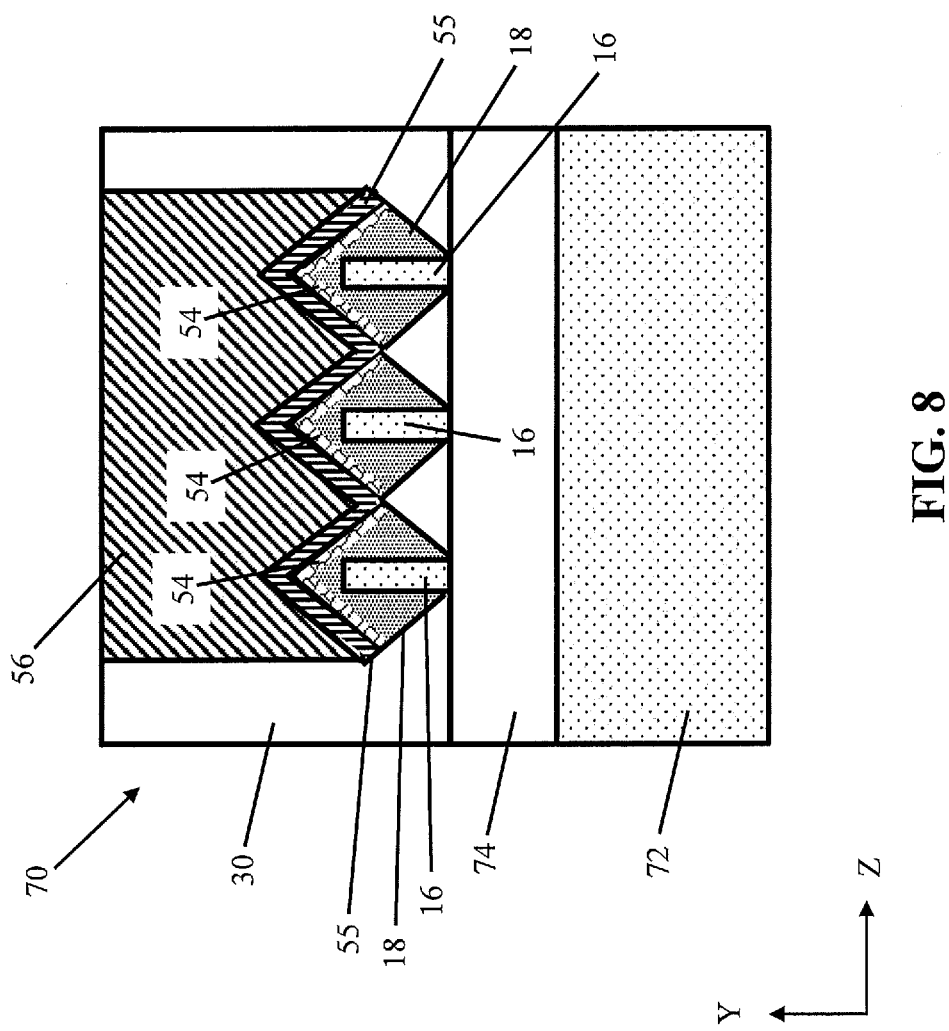
FIG. 8 provides a cross-sectional view in plane Z-Y of an IC structure embodied as a FinFET transistor according to embodiments of the present disclosure.

Turning to FIG. 8, another cross-sectional view of IC structure 70 in plane Z-Y is shown to further illustrate structures formed in embodiments of the present disclosure. In some embodiments, semiconductor elements 16 of IC structure 70 can be embodied as a group of fin-shaped elements in a FinFET transistor structure. In this case, IC structure 70 can include a substrate 72 including a semiconductor material and a buried insulator layer 74 positioned thereon. Each semiconductor element 16 can be positioned on an upper surface of buried insulator layer 74 such that semiconductor elements 16 protrude upwardly from buried insulator layer 74. Substrate 72 can have the same material composition as one or more of the example materials discussed elsewhere herein relative to semiconductor element(s) 16, or may include other semiconductor materials. In addition, buried insulator layer 74 can be composed of the same or similar materials described elsewhere herein relative to insulator 30.

Semiconductor element(s) 16 can be shaped into fins, e.g., by forming a region of bulk silicon or other semiconductor materials on buried insulator layer 74, and then removing portions thereof to form semiconductor element(s) 16 via any currently known or later developed process of removing a portion of a semiconductor material, e.g., depositing a material and performing a pattern etch. When embodied as a fin-shaped structure, each semiconductor element 16 can be used to form a PFET and/or an NFET transistor. A PFET transistor generally refers to a transistor with a p-type doped fin (i.e., source and drain regions), while an NFET transistor generally refers to a transistor with an n-type doped fin (i.e., source and drain regions). In a PFET, holes are responsible for conduction of electricity across the channel, while electrons are responsible for conduction of electricity across the channel in an NFET.

Conductive epitaxial layer 18 can be formed on any exposed surface of semiconductor fin(s) 16, including upper surfaces and sidewalls thereof, to form a substantially diamond-shaped region. It is understood that conductive epitaxial layer 18 can be formed in one of several alternative geometries, and a diamond shape is illustrated in FIG. 8 solely for the purposes of example. The formed conductive epitaxial layer 18 can optionally be merged with conductive epitaxial layers 18 formed on laterally adjacent fins. Forming conductive epitaxial layer(s) 18 in this configuration can cause boron etch stop layer 28 (FIGS. 2-7), boron-rich region 54, and silicide region(s) 55 to be formed with sloped exterior surfaces relative to the upper horizontal surfaces of semiconductor elements 16 and buried insulator layer 74. In addition, contact(s) 56 can be formed on silicide region(s) 55 such that one contact may provide an electrical connection to multiple semiconductor elements 16 (e.g., fins) simultaneously, through one or more merged or unmerged conductive epitaxial layers 18 and/or boron-rich regions 54. Liners 60 (FIG. 7) are omitted from FIG. 8 solely for clarity and simplicity. Where IC structure 70 includes one or more finFET transistor structures, contact(s) 56 can be formed to provide an electrical connection to multiple semiconductor element(s) 16 simultaneously and thereby reduce the total surface area occupied by IC structure 70 in a finished product.

The resulting IC structures described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. An integrated circuit (IC) structure comprising:
   a gate structure positioned on a semiconductor element;
   a conductive epitaxial layer positioned on the semiconductor element and laterally abutting a sidewall of the gate structure;
   a boron-rich region positioned on an upper surface of the conductive epitaxial layer, wherein the boron-rich region laterally abuts a pure boron layer positioned on the conductive epitaxial layer;
   an insulator positioned on the boron-rich region and laterally abutting the gate structure; and
   a contact extending through the insulator and positioned directly on an upper surface of the boron-rich region.

2. The IC structure of claim 1, further comprising a silicide region within the boron-rich region and directly underlying the contact.

3. The IC structure of claim 1, wherein the conductive epitaxial layer includes boron and a semiconductor material.

4. The IC structure of claim 1, wherein the boron-rich region includes silicon germanium and boron, and wherein the boron-rich region includes a substantially uniform boron concentration therein.

5. A field effect transistor (FET) comprising:
   a semiconductor substrate positioned on a buried insulator layer, wherein the semiconductor substrate includes a source region and a drain region;
   a gate structure positioned on the semiconductor substrate between the source and drain regions thereof, the gate structure defining a gate terminal of the FET;
   a pair of conductive epitaxial regions each positioned on a respective one of the source region and the drain region of the substrate, and laterally abutting opposing sidewalls of the gate structure, the pair of conductive epitaxial regions respectively defining source and drain terminals of the FET;

a pair of pure boron layers each positioned on a respective one of the pair of conductive epitaxial regions;

a pair of boron-rich regions each positioned on a respective one of the pair of pure boron layers;

a source contact positioned directly on an upper surface of one of the pair of boron-rich regions; and a drain contact positioned directly on an upper surface of the other of the pair of boron-rich regions.

6. The FET of claim 5, further comprising a pair of silicide regions each positioned within a respective one of the pair of boron-rich regions and directly underlying a respective one of the source contact and the drain contact.

7. The FET of claim 5, wherein each of the pair of conductive epitaxial layers includes boron and a semiconductor material.

8. The FET of claim 5, wherein each of the pair of boron-rich regions includes silicon germanium and boron, and wherein each of the pair of boron-rich regions includes a substantially uniform boron concentration therein.

9. A fin-type field effect transistor (FinFET) comprising:

a plurality of semiconductor fins each positioned on a buried insulator layer, and each including a source region and a drain region;

a gate structure positioned on the plurality of semiconductor fins between the source and drain regions thereof, the gate structure defining a gate terminal of the FinFET;

a plurality of conductive epitaxial regions each positioned the source region or the drain region of one of the plurality of semiconductor fins, and laterally abutting a sidewall of the gate structure, each of the plurality of conductive epitaxial regions defining a source terminal or a drain terminal of the FinFET;

a plurality of pure boron layers each positioned on a respective one of the plurality of conductive epitaxial regions;

a boron-rich region positioned on the plurality of pure boron layers;

a source contact positioned directly on a portion of an upper surface of the boron-rich region; and a drain contact positioned directly on a portion of the upper surface of the boron-rich region.

10. The FinFET of claim 9, further comprising a silicide region positioned within the boron-rich region and directly underlying the source contact and the drain contact.

11. The FinFET of claim 9, wherein each of the plurality of conductive epitaxial layers includes boron and a semiconductor material.

12. The FinFET of claim 9, wherein the boron-rich region includes silicon germanium and boron, and wherein the boron-rich region includes a substantially uniform boron concentration therein.

* * * * *